United States Patent
Lu et al.

(10) Patent No.: US 6,363,013 B1
(45) Date of Patent: Mar. 26, 2002

(54) AUTO-STOPPED PAGE SOFT-PROGRAMMING METHOD WITH VOLTAGE LIMITED COMPONENT

(75) Inventors: Wenpin Lu, I-Lan; Ying-Che Lo, Tainan; Ming-Shang Chen, Hsinchu; Baw-Chyuan Lin, Lunpai; Chun-Lien Su, Shanhua, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/652,230

(22) Filed: Aug. 29, 2000

(51) Int. Cl.[7] ............................................. G11C 16/04
(52) U.S. Cl. .......................... 365/185.18; 365/185.19; 365/185.24; 365/185.29; 365/185.3; 365/185.33
(58) Field of Search ....................... 365/185.18, 185.19, 365/185.29, 185.33, 185.26, 185.3, 185.22, 226, 185.24

(56) References Cited

U.S. PATENT DOCUMENTS

| 4,875,118 A | 10/1989 | Kaymaram | 360/99.12 |
| 5,233,562 A | 8/1993 | Ong et al. | 365/218 |
| 5,414,644 A | 5/1995 | Lin et al. | 365/218 |
| 5,508,959 A | 4/1996 | Lee et al. | 365/185.3 |
| 5,745,410 A | 4/1998 | Yiu et al. | 365/185.3 |
| 6,052,310 A | * 4/2000 | Sukavalli | 365/185.29 |
| 6,172,909 B1 | * 1/2001 | Haddad et al. | 365/185.19 |

FOREIGN PATENT DOCUMENTS

JP  404265599 A * 9/1992 ........... G11C/16/06

* cited by examiner

Primary Examiner—David Nelms
Assistant Examiner—David Lam
(74) Attorney, Agent, or Firm—Beyer Weaver & Thomas LLP.

(57) ABSTRACT

Method for soft-programming at least one floating gate memory cell in at least one page of a persistent memory device by converging the low threshold voltages of the several cells of the page within an optimal range, and apparatus implementing the method. The methodology of the present invention teaches connecting the individual drains of the several memory cells of the device of a given page, or block, to a voltage limited constant current circuitry component. The methodology applies a first positive voltage to the word line of the page and a second positive voltage to the common source in a fixed time period to converge the pages low threshold voltage distribution. The methodology is capable of implementation on either the source or drain side of the memory array.

14 Claims, 10 Drawing Sheets

Vct (Bit1, Bit2, Bit3, Bit4) after converged = (1.366V, 1.436V, 1.482V, 1.976V)
Vct (Bit1, Bit2, Bit3, Bit4) before converged = (-1V, 0V, 0.45V, 1.95V)

AUTO-STOPPED PAGE SOFT-PROGRAMMING METHOD WITH VOLTAGE LIMITED COMPONENT

BACKGROUND OF THE INVENTION

1. Field of the Invention

This invention relates to floating gate memory devices, including but not limited to devices such as flash EPROM, EEPROM, and the like. In particular the present invention relates to methods and circuits for converging the low threshold voltages of the several cells of the memory array into an acceptable range of values for such voltages, and for precluding the over soft-programming of these memory devices.

2. Description of Related Art

Non-volatile floating gate memory devices based on integrated circuit technology are important elements of many computer, communication, and consumer products. There currently exist several classes of non-volatile memory devices based on arrays of floating gate memory transistors, which devices are both programmable and erasable. These devices include, but are specifically not limited to flash EPROMs, and EEPROMs. Flash memory devices may be based on either EPROM or EEPROM technology.

A conventional flash EPROM memory array generally uses a single transistor with stacked polysilicon gates for each cell within the array. The transistor is typically formed on a p-type well, and has an n-type source and drain regions provided within the well. The transistors can be selectively charged or programmed, and typically hold their program charge for an extended period of time, thereby holding the information stored thereon in a non-volatile fashion.

Programming a flash EPROM cell generally involves injecting the floating gate of one or more selected cells in the array with channel hot electrons, thereby accumulating a net negative charge on the cell's floating gate. This "hot electron injection" is typically accomplished by simultaneously placing a positive voltage on both the control gate and drain of the cell. Injecting these electrons places a net negative charge upon the floating gate, thereby increasing the turn-on threshold of the memory cell. With this higher threshold, the cell is in a non-conductive state when addressed with a read voltage applied to the cell's control gate.

When erasure of one or more cells in a flash EPROM device is required, the negative charge in the floating gate of each cell is drained off, thereby lowering the turn-on threshold of the cell. With this lower threshold, the cell turns on to a conductive state when addressed with a read voltage applied to the control gate of the cell.

Conventional flash EEPROM memory arrays for low power applications use a low current charge transfer mechanism called channel Fowler-Nordheim (F-N) tunneling to increase electrons at the floating gate, thereby raising the threshold voltage $V_T$, and programming the cell. In this programming mechanism, charge is added to the floating gate of the memory cell through a thin layer of tunnel oxide. To erase one or more cells, these devices utilize bit line, or drain side F-N tunneling to discharge electrons from the floating gates thereof to lower the cell's low threshold voltage. In this erasure mechanism, charge is removed from the floating gate through the tunnel oxide layer. This methodology enables the simultaneous erasing and programming of different cells within the same page. It should be noted that the word "page" is defined herein as a certain number of cells within a common word line.

From the preceding discussion, it may be inferred that for a given memory storage device there is an optimal low threshold voltage, or range of low threshold voltages, which define the erased state for a given cell. This is indeed the case. It is also a fact however, that several factors can serve to move the low threshold voltage of a given cell out of the acceptable range for its desired state.

A first problem, which can occur during the erase operation, is that of over-erasure. Over-erasure occurs if too many electrons are removed from the floating gate, leaving the gate with a threshold voltage which is too low. This very low threshold voltage, defined as either negative, zero, or only slightly positive, biases the memory cell slightly on, so that a small current can leak through the memory, even when the cell is not addressed, thereby causing a false reading. Thus, an over-erased cell can cause a false reading due to its leakage current.

A second problem is that over-erasure not only causes the previously discussed false readings, but it can render more difficult the successful re-programming of cells, especially for channel hot electron programming. This additional problem eventuates because the number of electrons, or net charge, required to change an over-erased cell to the programmed state is larger than for normal cells. Accordingly, a charge normally sufficient to program a cell may not raise the over-erased cell's threshold voltage high enough to reliably program the cell.

A third problem is that the design of conventional flash EEPROMs often utilizes a double implant at the drain side to reduce band-to-band stress. The shallower source side junctions within such a cell are also known to enhance a secondary hot electron injection, which enhances soft programmability. Cell reliability would be degraded where electron injection and discharge are contemporaneously conducted in the same region of the array, that is to say, drain side in flash EEPROMs, and the soft program efficiency of the deeper double implant drain side is also lower than that of shallower source side.

Finally, because F-N tunneling can produce an abnormal discharge behavior for some cells, particularly where electron injection and discharge are simultaneously conducted in close proximity, the range of threshold voltages for several of the cells in the array can fall out of design bounds. In other words, it is possible that F-N tunneling may cause one or more abnormal cells in a page to have an ultra-low threshold voltage while other cells in the page are at the high end of the low threshold range, or may even exceed the high end of this range. This wide divergence can affect the reliability of the several cells within the array, as previously discussed.

Because both the erase and program operations can affect different cells within a single array in different manners, floating gate memory designs often include circuitry for verifying the success of the erase and program steps. One such device is taught in U.S. Pat. No. 4,875,118. In accordance with the principles enumerated in this reference, if an array does not pass an erase-verify step the entire array is usually re-erased. Where one or more cells have been so over-erased as to lower the threshold voltage below the normal range, some of these re-erase methodologies actually aggravate the already the over-erased cells in the array.

U.S. Pat. No. 5,414,664 teaches one solution to this over-erase problem associated with prior erase verification processes. The invention taught therein teaches a method wherein only those blocks in a memory array which have failed the erase verify operation are re-erased. This then precludes the re-erase of the entire array after each verify operation, thereby mitigating the over-erase phenomenon. Although the methodology taught in this reference mitigates the problem it does not solve it entirely, as cells which have been over-erased are not repaired following the over-erasure. Accordingly, a repair process was needed which actually corrects over-erased cells.

One such repair process, disclosed in U.S. Pat. No. 5,233,562, teaches a methodology for effecting such a repair using so-called drain disturb, source disturb, or gate disturb techniques. After each repair performed by the process taught in this reference, a time-consuming repair verification operation of the entire array is required. In order to perform these repair and repair verification processes in a more time efficient manner, further improvements were required.

A methodology which improves the timeliness of repairs to over-erased cells in flash memory and other floating gate memory devices is taught in U.S. Pat. No. 5,745,410, herewith incorporated by reference. The methodology taught therein addresses over-erasure, but fails to address some of the other underlying causes of flash memory failure.

A first problem not addressed by the '410 reference is that of low threshold voltage divergence following one or more erase events. As previously discussed, the low threshold voltage of a cell should fall within a specified range. In at least one design, this range is between about +0.5 and about +2.0 V.

A second problem not addressed by the '410 reference, which can occur during soft-programming of the cell, is that of over-writing or over soft-programming one or more cells in an array. In contrast to over-erasure, over soft-programming occurs where too many electrons are added at the floating gate, leaving the gate at a voltage level which is higher than the desired high end of the low threshold voltage range. A threshold voltage which is this high can be resistant to erasure efforts, thereby rendering subsequent programming of the cell problematic.

What would be necessary to obtain the advantages not fully considered in the references discussed above is a quick and reliable method for converging the threshold voltages of the cells of a memory array to an acceptable level within a range of threshold values after the erasure of a block or page of cells. This is particularly true when the block comprises only a few cells. Such a methodology should moreover preclude the over-soft-programming of any of the cells of the memory.

In implementing such a methodology a further difficulty eventuates. This difficulty is discussed having reference to FIGS. 6 and 7. By plotting source voltage $V_S$ and source current $I_S$ vs. convergence time for 4 cells being simultaneously in a low threshold voltage state, it is shown that $V_S$ is near a cut down point of 2V, and Is is only changed from about 100 $\mu A$ to near zero current. From the above consideration it becomes apparent that a suitable cut down voltage, $V_S$ at $I_S$ being equal to zero for fixed gate voltage $V_G$, is needed in order to avoid over soft-programming. If a turning point is significantly less than 2.25V, the cell having the highest $V_T$ will gain too much additional $V_T$, thereby causing logic state misjudgment.

SUMMARY OF THE INVENTION

The present invention teaches a novel methodology for converging the threshold voltage distribution for any number of low-threshold voltage cells in one or more pages or blocks of array memory, and an apparatus to perform the methodology. The method avoids the over-discharge of each of the cells. In addition to converging the over-discharged cells and threshold distribution, the methodology taught herein precludes over soft-programming and prevents the high side of a low threshold voltage distribution from being raised to unacceptable levels.

Taught herein is an auto-stopped page soft-programming method utilizing a voltage limited component for the soft-programming of one or more floating gate memory cells in the same page or block within a memory array. The method teaches connecting the several drain column lines of the array to a constant current (or voltage limited) source component which controls power consumption and avoids over soft-programming, even when only a relatively few cells within the page or block are at a low threshold voltage. The methodology applies a first positive voltage to the word line of that page or block and a second positive voltage to the common source of the array in a fixed time period to converge the page's threshold voltage distribution. According to the methodology taught herein, the source and drain sides can be interchanged.

These and other advantages of the present invention will become apparent upon reading the following detailed descriptions and studying the various figures of the Drawing.

BRIEF DESCRIPTION OF THE DRAWING

For fuller understanding of the present invention, reference is made to the accompanying drawing in the following Detailed Description of the Invention. In the drawing.

Reference numbers refer to the same or equivalent parts of the invention throughout the several figures of the Drawing.

DETAILED DESCRIPTION OF THE PREFERRED EMBODIMENTS

The detailed description of certain preferred embodiments of the present invention is provided with reference to the several figures of the Drawing. The soft-program of this invention is preferably part of an embedded erase sequence of a floating gate memory cell device, the device including an array of cells arranged in blocks or pages. The soft-program taught herein converges the low threshold voltage of one or more cells of the array, while precluding the over soft-programming of any of the cells.

Figure 8:
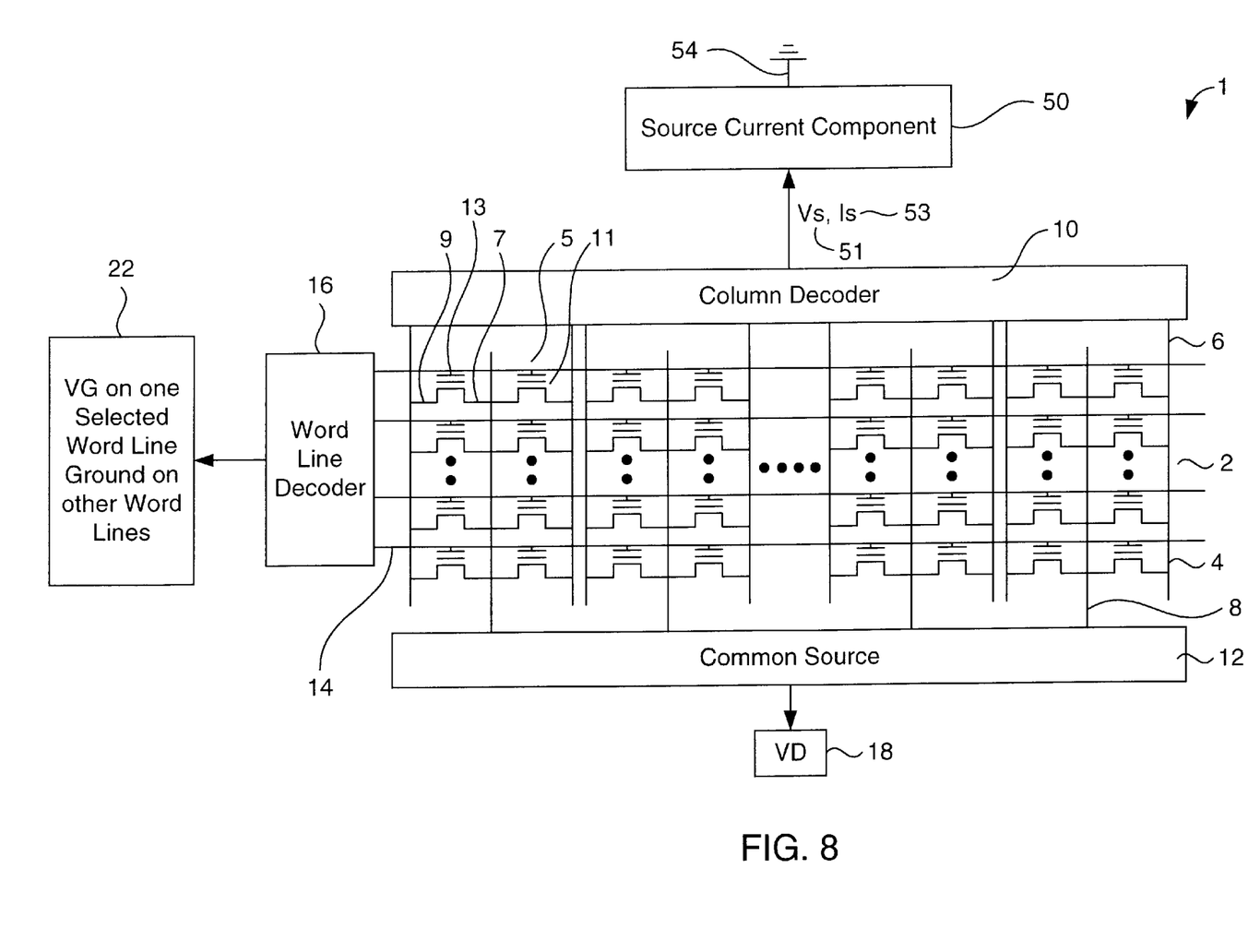
FIG. 8 is and electrical schematic diagram, in partial block form, of the memory cell incorporating the source current component of the present invention.

Having reference to FIG. 8, the basic structure of one floating gate memory cell integrated circuit device 1 incorporating the features of the present invention is shown. Device 1 includes a memory array, generally 2, comprising a plurality of floating gate cells, 4. Each cell, 4, comprises at least one floating gate transistor 5, having a source 7, a drain 9, a floating gate 11, and a control gate 13. Each of the control gates 13 in a row of cells is connected to a word line, 14. Each of the plurality of word lines 14 is in turn connected to a word line decoder 16. The source 7 of each of the plurality of cells 4 is connected to a common source line, 8, which is in turn connected to common source 12. The drain 9 of each of the plurality of cells 4 is connected to a drain column line, 6. Each of the plurality of drain column lines 6 is connected to column decoder 10. Column decoder 10 is in turn connected to the novel source current component, 50, of the present invention. Common source 12 is further connected to voltage reference source 18. Word line decoder 16 is in turn connected to a gate voltage source 22. It will be recognized by those having ordinary skill in the art that, depending on the architecture of the array, a single conductor may act as both a source line and a drain line between adjacent memory cells. Accordingly, it will be understood that in the following discussion, the principles of the present invention taught herein specifically contemplate exchanging the source and the drain sides.

A control circuit, not shown, is connected to drain lines 6, source lines 8, and word lines 14 in a plurality of pages or blocks, not defined in this view. The principles of the present invention are capable of being implemented in conjunction with, and improving upon the performance of a number of floating gate memory devices. One such device is discussed in the incorporated reference, U.S. Pat. No. 5,745,410.

A non-negative voltage, $V_G$, is applied to the word line defining selected page. A second positive voltage $V_D$, being greater that approximately 3V, is then applied to the common source side which, during soft-programming, acts as the array drain side. Accordingly, during the soft-programming step this current I, applied to the common source side will be referred to as $I_D$, and the voltage V, as $V_D$.

Figure 1:
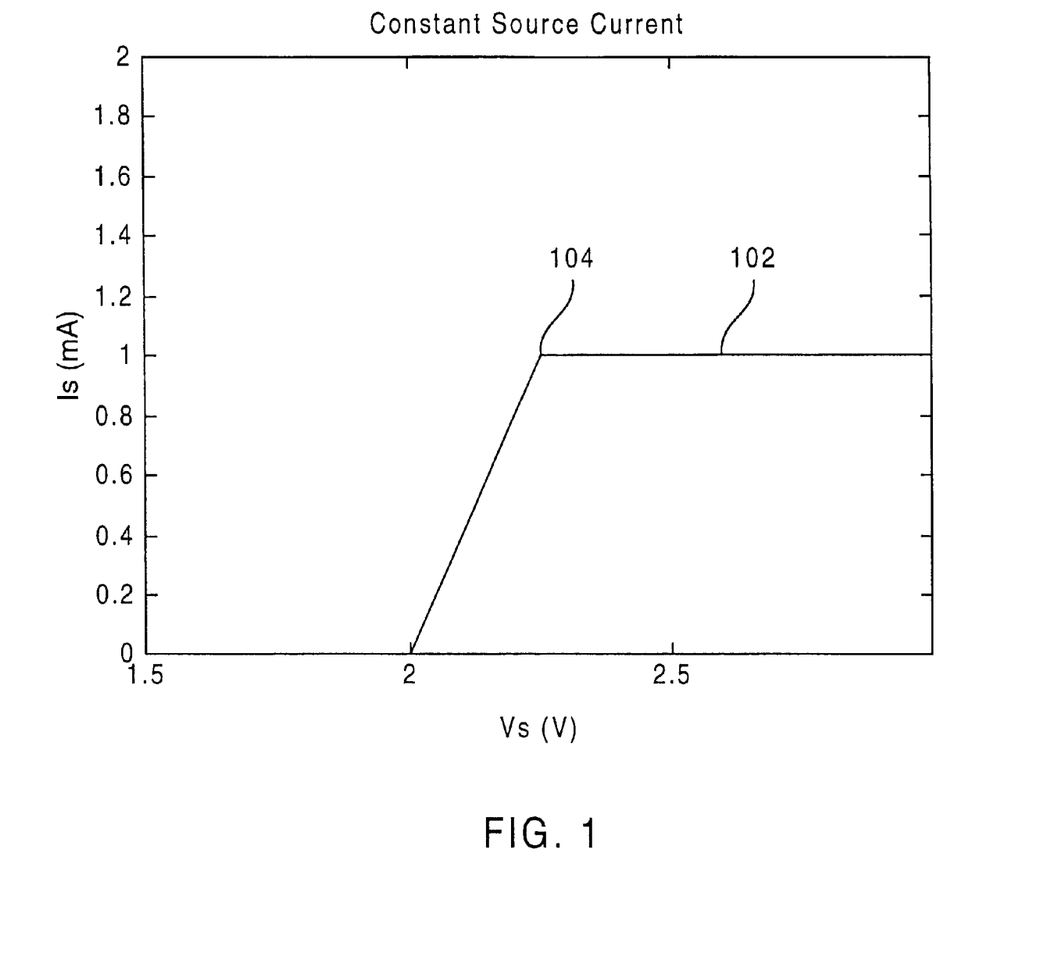
FIG. 1 is a plot of the common drain side current, acting as the array source side current during soft-programming, $I_s$, plotted against source voltage, $V_S$.
Figure 9:
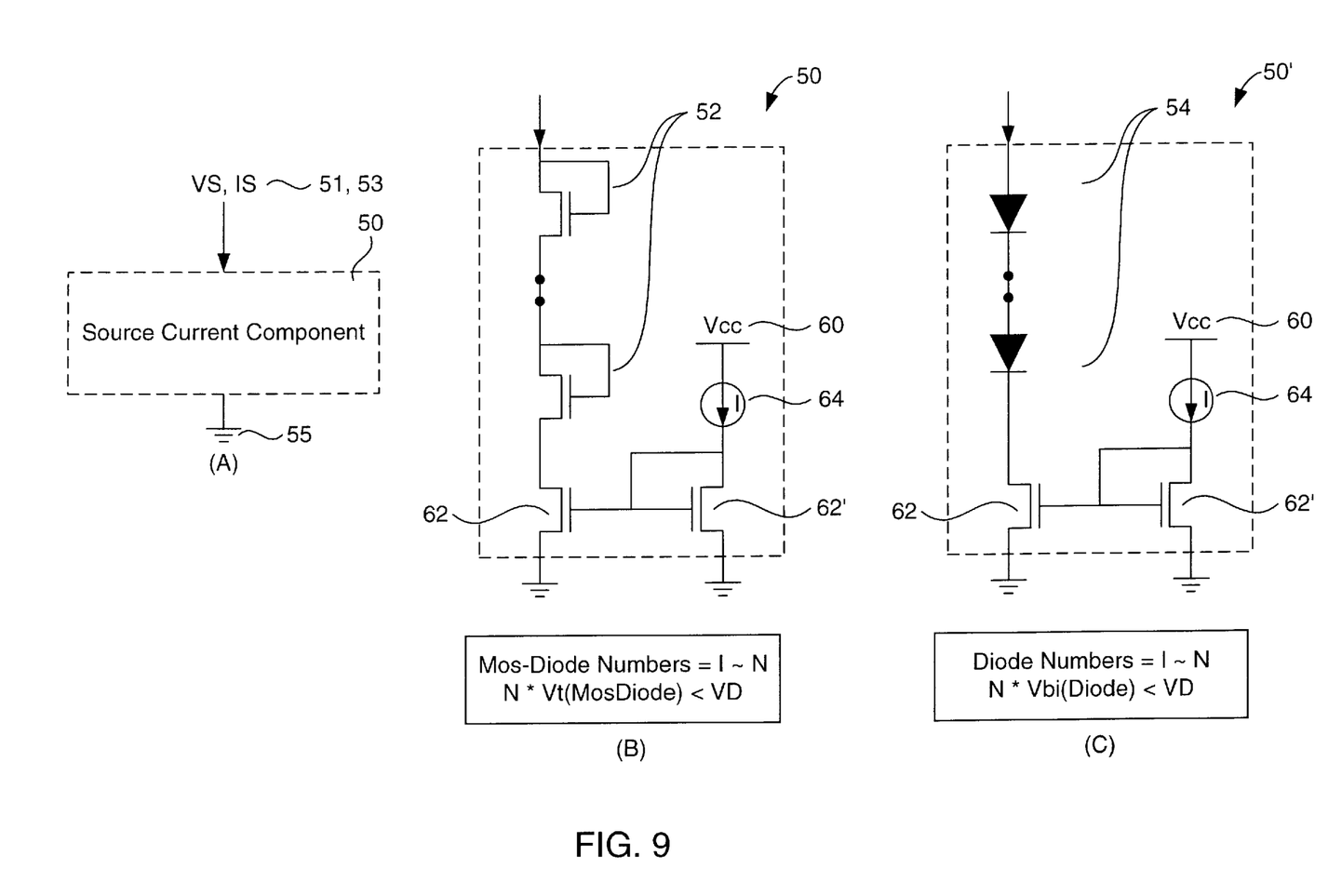
FIG. 9A is a block diagram of the source current component of the present invention with an overview of its electrical connections.
FIG. 9B is one embodiment of the circuitry taught by the present invention for connecting to the common drain side of a memory block to achieve constant power consumption and to avoid over soft-programming, the circuit utilizing MOS-diodes.
FIG. 9C is one embodiment of the circuitry taught by the present invention for connecting to the common drain side of a memory block to achieve constant power consumption and to avoid over soft-programming, the circuit utilizing diodes.

Having reference to FIG. 9, an overview of the novel source current component, 50, of the present invention is shown. Source current component 50 provides a source voltage $V_S$, 51, and source current $I_S$, 53, and is grounded at 55. Source current component 50 provides the current for source-side secondary hot electron injection as a soft-programming method, further described below. One implementation of source current component 50 produces a current-voltage curve as shown in FIG. 1. Referring to that figure, it is shown that for a constant source current of one mA, source voltages above 2.25 volts are realized. This circuitry is connected to all of the drain sides on one page, and acts as the source side during the soft-programming step, hereinafter discussed. Accordingly, the current, I, and voltage V, produced by source current component 50 will be referred to as source current $I_S$ 53 and source voltage $V_S$ 51 during soft-programming. Two alternative embodiments of source current component 50 are detailed in FIGS. 9B, and 9C.

Referring to FIG. 9B, one embodiment of source current component 50 utilizing MOS-diodes is shown. Source current component 50 includes one or more MOS-diodes 52, connected to a current mirror as shown. Substantially any current mirror methodology known to those having ordinary skill in the art may be utilized. In this embodiment, the current mirror includes a constant current voltage source $V_{cc}$, 60 applied to a diode 64 in operative combination with two MOS-diodes 52. In this embodiment, the current mirror is formed of MOS-diodes 62, 62' and diode 64. A voltage $V_{cc}$, 60 is applied to diode 64. In series with MOS diode 62 are one or more MOS-diodes 52. The number, N, of MOS diodes 52 for a given device is dependent on the architecture of the memory array, and is calculated according the following inequality:

$$N<(V_D/V_{T(MOS\text{-}diode)})$$

where $V_D$ is equal to reference voltage 18, not shown in this view, and $V_{T(MOS\text{-}diode)}$ is the threshold voltage of MOS diodes 52.

Referring now to FIG. 9C, an alternative embodiment of source current component, shown as 50', is detailed. This embodiment replaces MOS diodes 52 with diodes 54. The number, N, of diodes 54 for a given device is again dependent on the architecture of the memory array, and is calculated according the following inequality:

$$N<(V_D/V_{BI(diode)})$$

where $V_D$ is equal to reference voltage 18, not shown in this view, and $V_{BI(Diode)}$ is the bias voltage of diodes 54.

In the embodiment of the present invention shown in FIG. 8, source current component 50 attaches to column decoder 10 on the drain side of array 2. As previously discussed, for many architectures source lines 8 and drain lines 6 are substantially interchangeable. Accordingly, the principles of the present invention specifically contemplate the employment of source current component 50 interchangeably with either the drain side or source side of memory array 2 to provide source side secondary hot electron injection as a soft-programming method.

The principles of the present invention specifically contemplate the utilization thereof on a wide variety of memory devices, including but specifically not limited to flash EPROMs and EEPROMs. Accordingly, the principles disclosed herein, when combined with the knowledge of one having ordinary skill in the art, will render obvious the implementation of the present invention on a number of memory devices. Such devices may utilize a wide variety of control logic and circuit designs. The principles of the present invention specifically contemplate the implementation of the teachings hereof with all such control logic and circuit designs.

The soft-programming methodology discussed herein provides the previously enumerated features and advantages over the discussed references. Accordingly, this soft-programming methodology may be substituted into, or implemented in a number of existing non-volatile storage devices. One such device is detailed in the incorporated reference.

Figure 10:
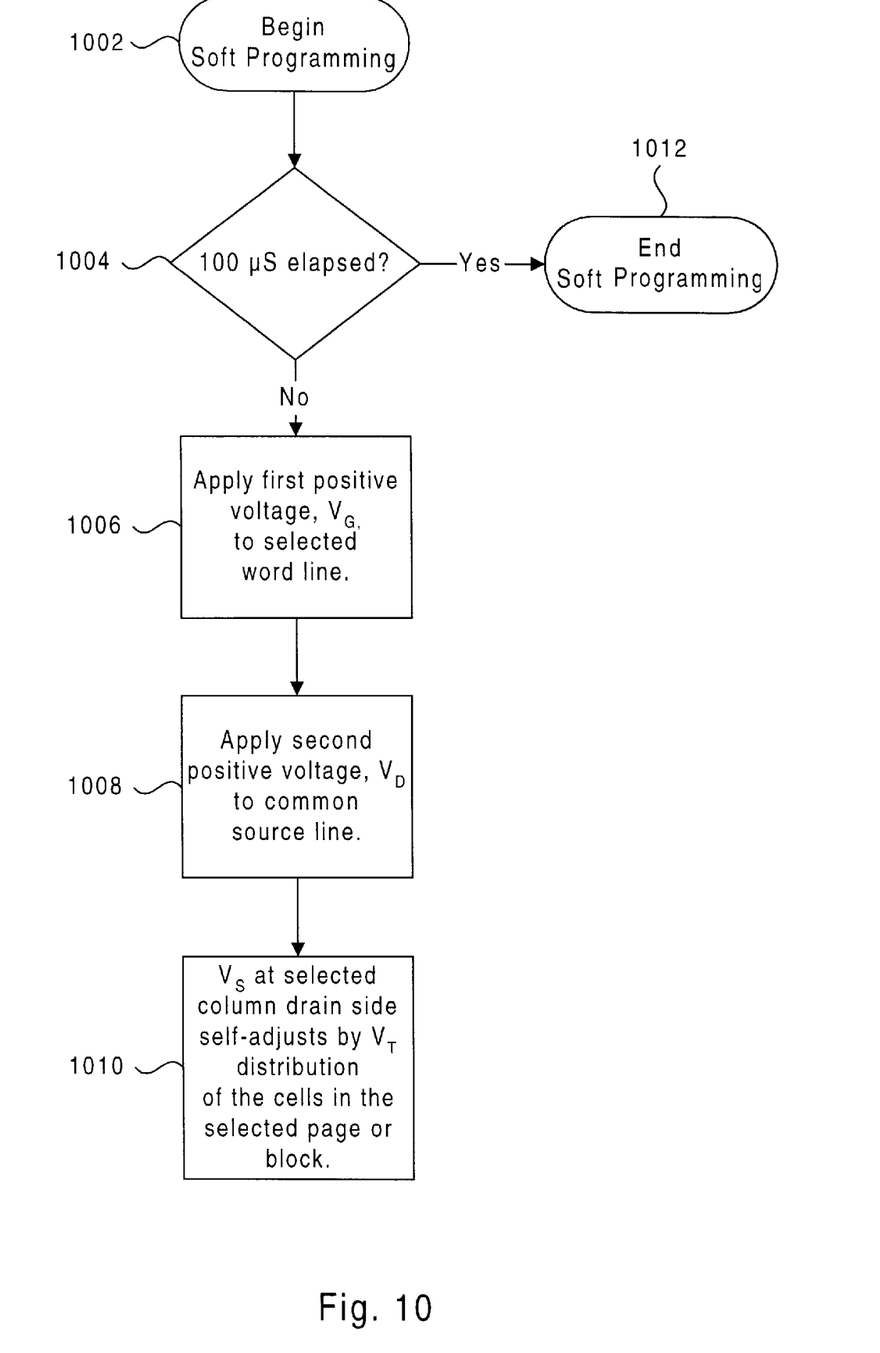
FIG. 10 is a flow chart representation of the methodology taught by the present invention.

The soft-programming methodology of the present invention is summarized in FIG. 10. Having reference to that figure, as well as to FIG. 8, the soft-programming methodology 100 of the present invention is discussed as follows: following the initiation, at 1002, of soft-programming, a determination is made at 1004 if a predetermined period of time, referred to as the soft-programming interval, has elapsed. The soft-programming interval is defined to be the period of time required to complete the soft-programming step. In accordance with one embodiment of the present invention, one soft-programming interval is defined as 100 $\mu$S, although other soft-programming intervals are specifically contemplated by the present invention. The present invention contemplates that soft-programming intervals in the range of 0.01 $\mu$S—1 second may be necessary. Preferably, intervals in the range of 1 $\mu$S to 0.1 sec may be implemented. Still more preferably, intervals in the range of 10 $\mu$S to 10,000 $\mu$S may be specified.

If, as a result of the determination made at 1004, that the soft-programming interval, e.g. 100 $\mu$S, has elapsed, soft-programming is terminated at 1012.

In the alternative, if it is determined at 1004 that the soft-programming interval has not elapsed, a first positive voltage $V_G$ is applied at 1006 through word line decoder 16 to the word line of the selected block or page of memory array 2 to be soft-programmed.

At 1008 a second positive voltage $V_D$ is then applied to common source side 12. The reference voltage $V_D$ is only set high enough to act as a secondary hot electron injection source.

At 1010 source current component 50 self-adjusts source voltage $V_S$ to a predetermined voltage applied to column decoder 10, which acts as the common source during soft-programming. As discussed, the voltage $V_S$ is a function of the design of source current component, 50, and $V_G$ adjusts $V_S$ to the appropriate point. The auto stop feature implemented by current component 50 is explained as follows: when a given number of cells are selected, those cells have a range of threshold voltages, $V_T$. The current of a cell like a transistor is proportional to the gate-to-source bias voltage $V_{GS}$ minus the threshold voltage $V_T (V_{GS}-V_T)$ or the square thereof $(V_{GS}-V_T)*(V_{GS}-V_T)$. $V_{GS}-V_T$ is equivalent to $(V_G-V_S-V_T)$. Moreover, the current for a group of cells in an array is the sum of the current for the each cell. Therefore, if $V_G$ is kept at a fixed bias and $I_S$ is kept constant, $V_T$ increases, $V_S$ decreases, and the number of low threshold voltage cells decreases as the source voltage $V_S$ decreases.

When a first positive voltage, $V_G$ is applied to the selected gates and a second positive voltage $V_D$ is applied to the drain side, or to the component which acts as the drain side during soft programming, the source voltage $V_S$ will self-bias at the appropriate voltage. Accordingly, source current component 50 of the present invention is designed to maintain the source current $I_S$ at a constant level or plateau region for the selected cells having low threshold voltage $V_T$ states.

When only a few cells within the selected group of cells have a low threshold voltage state, source current component 50 of the present invention is designed with a cut-down point to preclude the previously discussed over soft-programming problem. Accordingly, the value for the gate voltage $V_G$ and the source current component are designed to simultaneously improve soft-programming efficiency while reducing over soft-programming.

The operation of source current component 50 with respect to the soft-programming methodology previously discussed is more fully appreciated having reference to FIGS. 1 through 7.

Having reference now to FIG. 1, for a 1k cell distribution where one or more cells are presumed to have a low threshold voltage, $V_G$ is designed to allow $V_S$ to fall in the source current Is plateau region 102 before and after soft-programming. It will be noted that in this example, source voltages above 2.25 volts yield a source current plateau 102 of one mA. The turning point, 104, at which the source current plateau 102 is reached is approximately 2.25 volts. Accordingly, a small voltage is applied at the beginning of soft-programming, approximately 0.2 to 0.4 volts prior to the turning point in order to insure that a sufficiently large current is used for the 1k cell low threshold voltage cell distribution.

Figure 2:
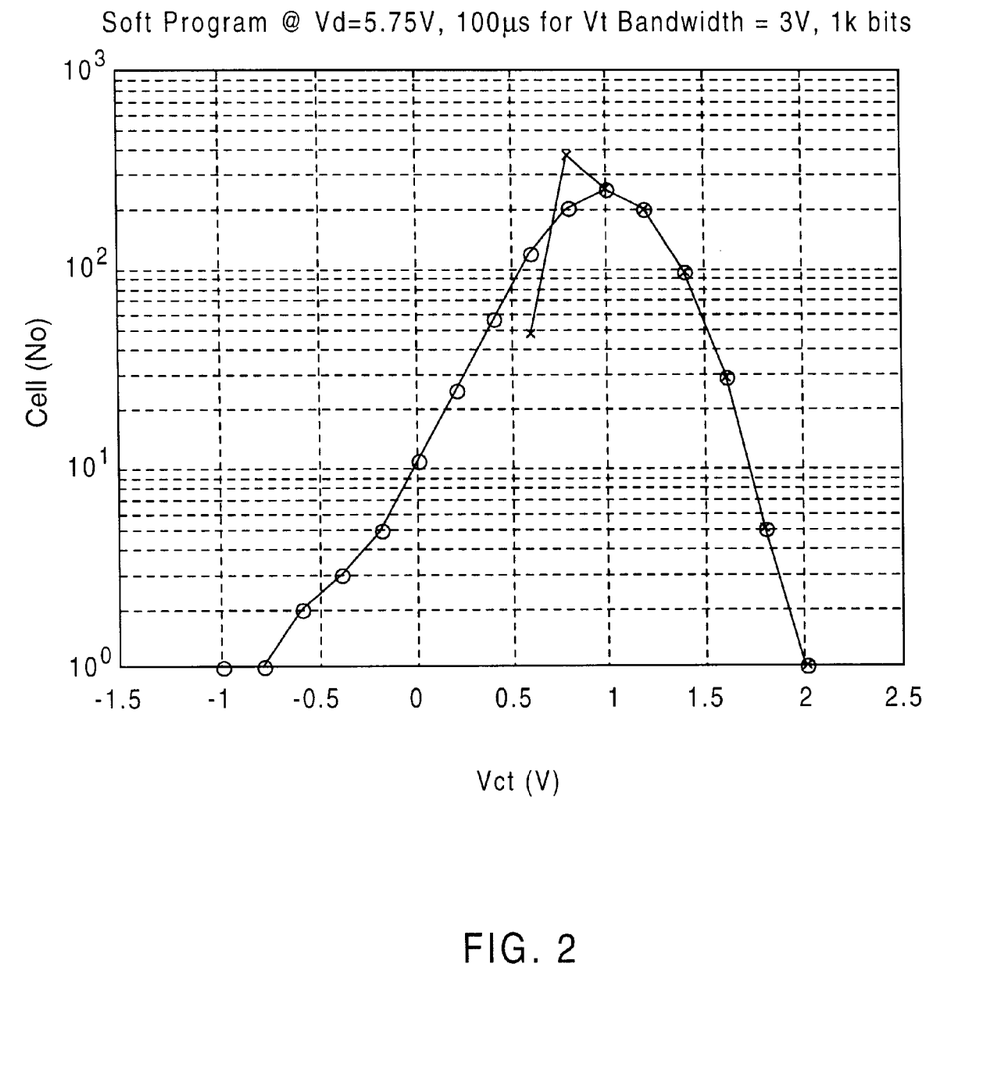
FIG. 2 is a plot of the threshold voltage distribution of a 1k cell page before and after a 100 $\mu S$ soft-programming event.

Referring now to FIG. 2, there is shown the effect of the 100 $\mu$S soft-programming step previously discussed. Having reference to this figure, it is shown that the soft-programming step previously discussed results in the distribution of 1k cells convergent to above 0.5 volts and below 2.0 volts.

Figure 3:
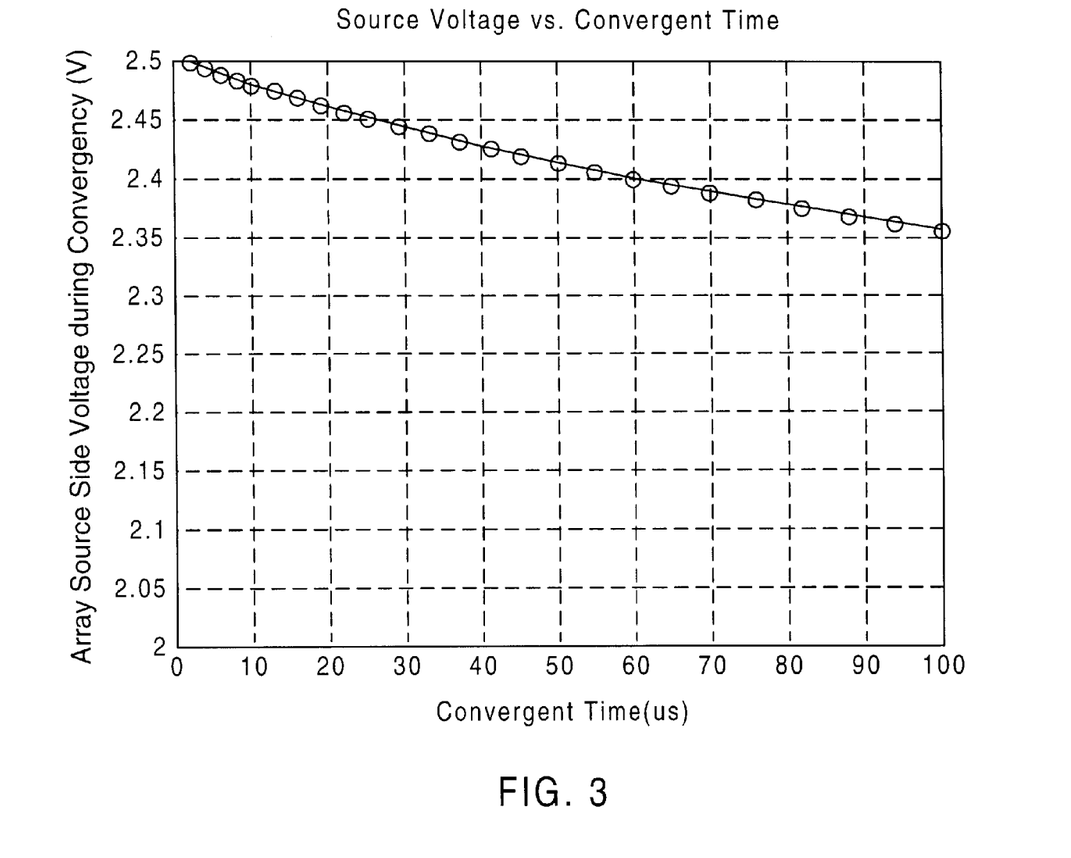
FIG. 3 is a plot of the common drain side voltage, acting as the array source side voltage during soft-programming, $V_S$, plotted against source current, $I_s$.
Figure 4:
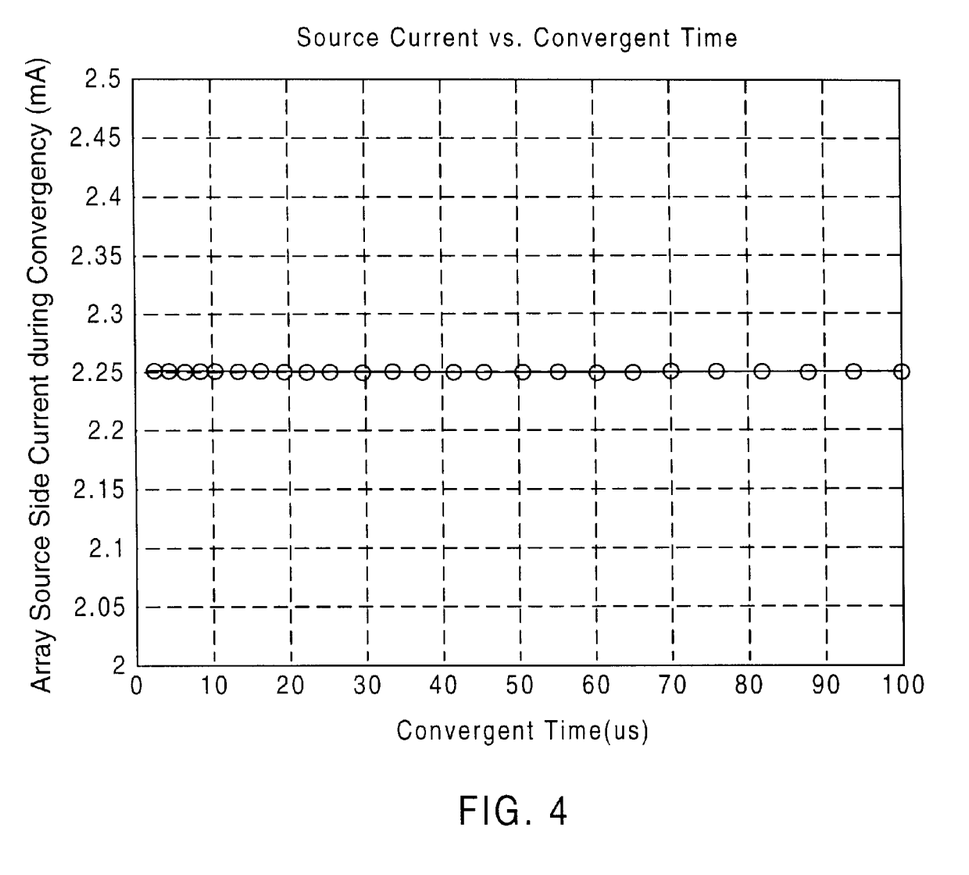
FIG. 4 is a plot of the common drain side current, acting as the array source side current, $I_s$ during soft-programming, plotted against the time for simultaneously converging a 1k cell page.
Figure 5:
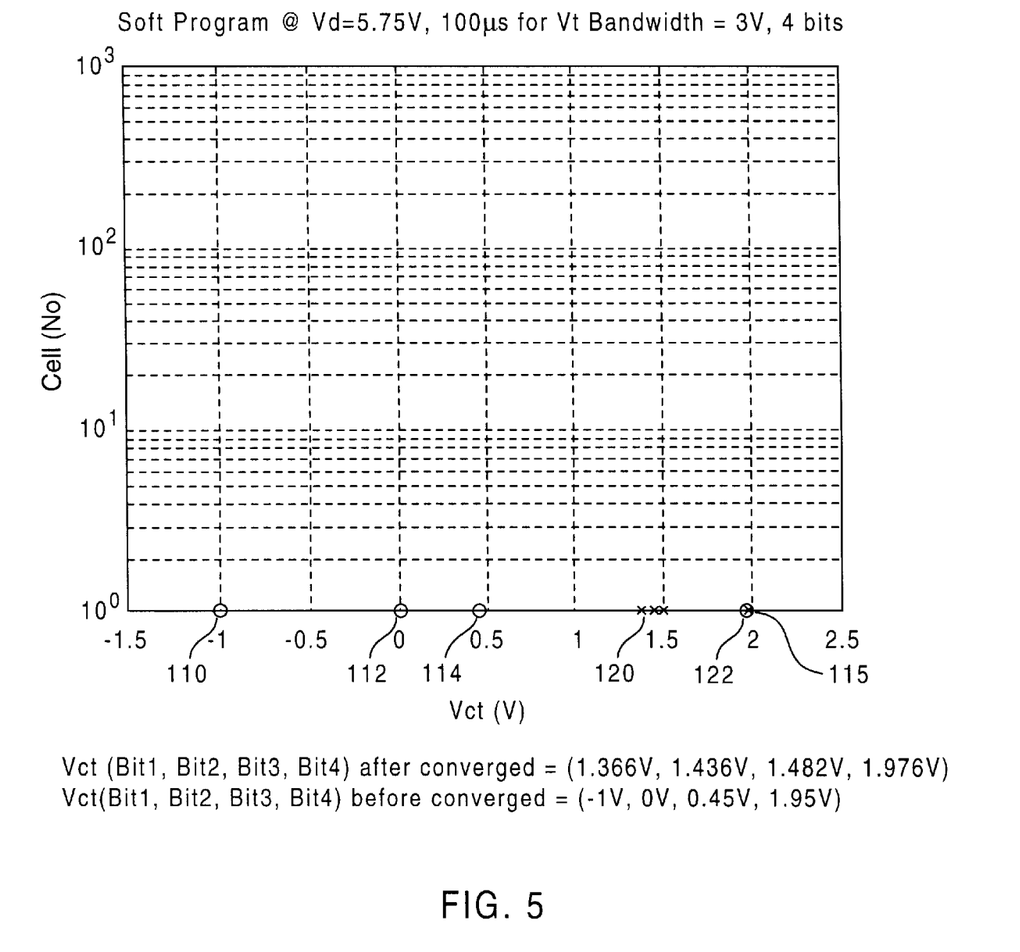
FIG. 5 is the threshold voltage distribution for 4 cells in a page, before and after a 100 $\mu S$ soft-programming event, demonstrating the threshold voltage convergence following the event.

Having reference now to FIGS. 3 and 4, the operation of source current component 50 on the array source side voltage $V_S$ and current Is during a 100 $\mu$S convergence for 1k cells having low threshold voltages is shown. At the start of the convergence, the source voltage $V_S$ provided by source current component 50 is shown to be approximately 2.5 volts. During the convergence interval, source voltage $V_S$ is decreased to approximately 2.35 volts. Over the same interval it will be appreciated that the source current $I_S$ remains constant at one mA. The application of the automatically decreasing source voltage over a limited soft-programming period precludes over soft-programming of any cell of the array. This then ensures that the low threshold of any cell within the array is converged within the acceptable range of low threshold voltages. In the example just presented, this range is from 0.5 to 2 positive volts.

Where only a few cells are discharged during the writing of the page, for instance four cells, the application of the principles of the present invention are further shown to converge the threshold voltages of the cells while precluding the over soft-programming thereof Having reference to FIG. 5 the initial threshold voltages before the threshold voltage convergence provided by the present invention of the four cells are shown at 110, 112, 114 and 115 to be -1V, 0V, 0.45V and 1.95V respectively. It will be appreciated that, with the exception of the 1.95V cell, each of these threshold voltages is substantially out of the acceptable range of threshold voltages for this device. The 1.95V cell is quite close to the 2V upper value for low voltage threshold values in this embodiment, and prior to the implementation of the present invention, would be very susceptible to over soft-programming.

After the application of the soft-program taught in the present invention, the threshold voltages for these cells are shown to have converged, at 120 and 122 to values of 1.366V, 1.436V, 1.482V and 1.976V respectively. It will be further appreciated that each of these threshold voltages subsequent to the soft-programming event taught herein is now within the range of acceptable threshold voltages for this device. The cell having the highest initial threshold voltage, 1.95V, gained only 0.026V during soft-programming, while each of the other cells were all converged above 0.5 volts. In the case of the cell having the lowest initial threshold voltage, −1V, that cell gained almost 2.5 volts. It should be noted that if the turning point is much less than 2.25V, the cell having the highest initial threshold voltage will gain too much threshold voltage, thereby causing the misjudging of the desired logic state.

Figure 6:
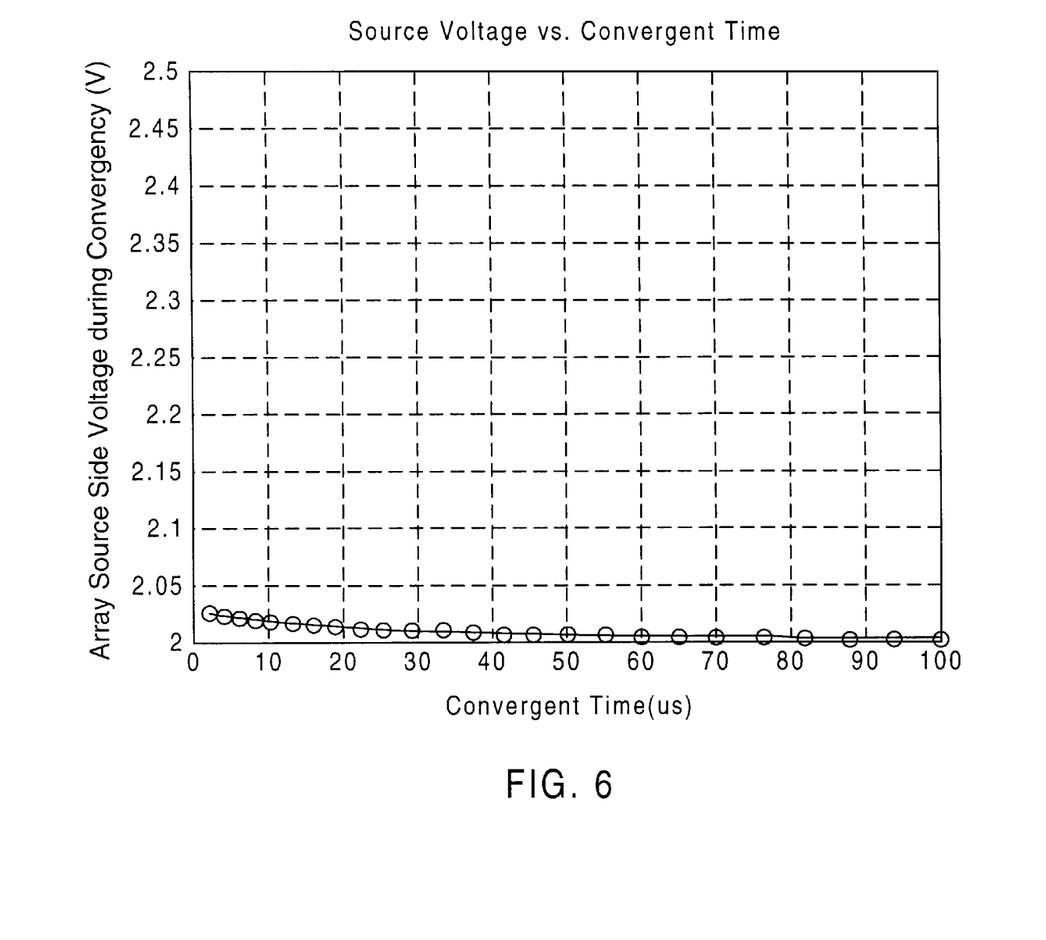
FIG. 6 is a plot of the common drain side voltage, acting as the array source side voltage during soft-programming, $V_S$, plotted against the time for simultaneously converging a 4 cells in a page.
Figure 7:
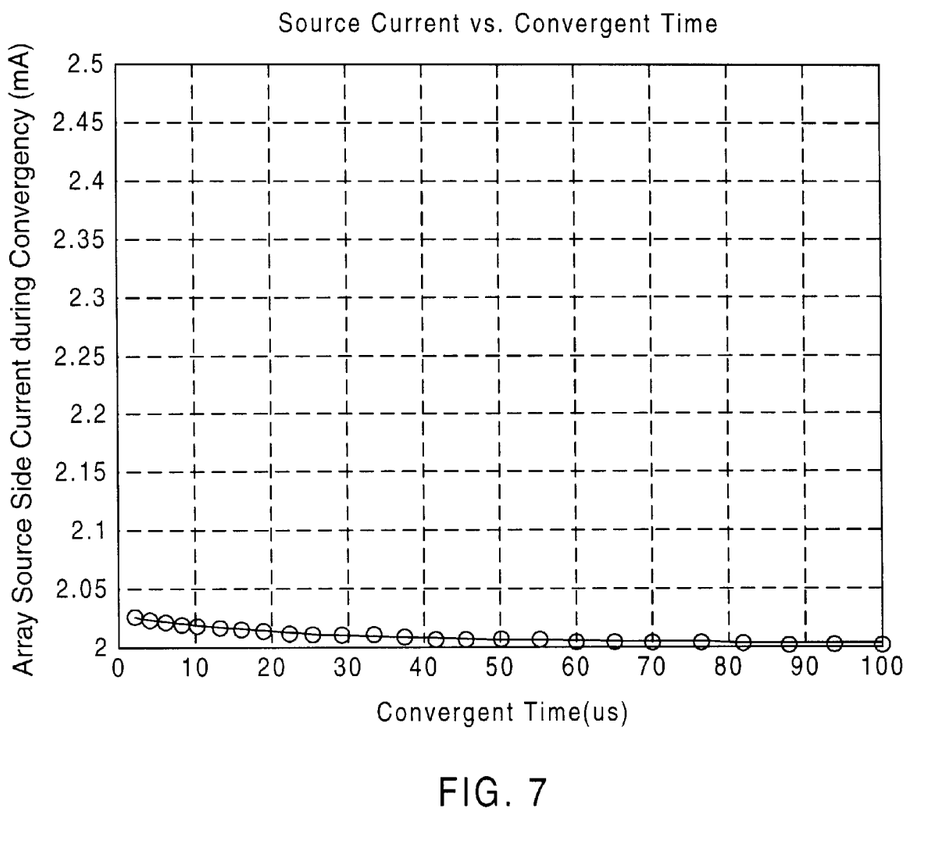
FIG. 7 is a plot of the common drain side current, acting as the array source side current during soft-programming, $I_S$, plotted against the time for simultaneously converging a 4 cells in a page.

The operation of present invention differs in several respects from the soft-programming step as taught in the incorporated reference. A first and obvious difference is that the time required for soft-programming is halved to 100 $\mu$S. This means that the soft-programming step requires less time to complete than many prior soft-programming schemes. Graphs of source voltage versus convergence time and source current versus convergence time are shown at FIGS. 6 and 7, respectively.

The preceding discussion has centered on the implementation of the present invention on a flash EEPROM. The principles of the present invention specifically contemplate the application thereof to EPROM technology as well, in order to soft program the over-erased cells after block erasing. This block size could include the entire array, a sector of the array, or any number of cells in a given sector in an array. When utilized on EPROM technology, a non-negative voltage connects to all the control gates on the selected block. A second positive voltage, again being around three volts connects to all the drain sides on the selected block, and over a fixed time, 100 $\mu$S in one embodiment, converges the threshold voltage distribution of the several cells of the selected block. Accordingly, this embodiment of the present invention provides a quick and reliable methodology to converge the cells' threshold voltages after erasing a selected block. These advantages are especially evident when there are only a few selected cells within a block, as over soft-programming is avoided, as previously discussed.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the principles of the present invention specifically contemplate the incorporation of one or more of the various features and advantages taught herein on a wide variety of non-volatile memory devices including but specifically not limited to EPROMs, EEPROMs, flash memory devices and combinations of the foregoing. Moreover, while the examples presented herein specify ranges and values for certain electrical measurements, it will be obvious to those having ordinary skill in the art that the advantages taught herein are applicable over a wide spectrum of such values. Each of these alternatives is specifically contemplated by the principles of the present invention. The invention disclosed herein may be practiced without any element which is not specifically disclosed herein.

What is claimed is:

1. For a floating gate memory device incorporating an array of floating gate memory cells including a plurality of rows and columns, a method for soft programming at least one cell in at least a portion of the array by implementing source side secondary hot electron injection, the method comprising the steps of:

applying a first positive voltage, $V_G$, to a selected word line of the array;

applying a second positive voltage, $V_D$, to a common source of the array;

with a control circuit including a source current component coupled to at least one of the column decoder, converging the low threshold voltage of the at least one cell of the array to a desired low threshold state; and after a pre-determined period of time, terminating the converging step, wherein the converging step comprises the further step of adjusting a source voltage $V_S$ applied to the source current component to a pre-determined voltage.

2. The method of claim 1 wherein the adjusting step further comprises the step of self-biasing the source voltage $V_S$ by the threshold voltage $V_T$ distribution of the at least one cell in the portion of the array.

3. The method of claim 2 wherein the self-biasing step comprises the further step of maintaining, with the source current component, the source current $I_S$ at a constant level.

4. The method of claim 3 wherein the maintaining step further comprises maintaining the source current with a source current component including a current mirror in operative combination with at least one diode.

5. The method of claim 3 wherein the maintaining step further comprises maintaining the source current with a source current component including a current mirror in operative combination with at least one MOS-diode.

6. For a floating gate memory device incorporating an array of floating gate memory cells including a plurality of rows and columns, a method for soft programming at least one cell in at least a portion of the array by implementing source side secondary hot electron injection, the method comprising the steps of:

applying a first positive voltage, $V_G$, to a selected word line of the array;

applying a second positive voltage, $V_D$, to a common source of the array;

with a control circuit including a source current component coupled to at least one of the column decoder, converging the low threshold voltage of the at least one cell of the array to a desired low threshold state comprising the step of:

preventing the over soft-programming of the cell; and specifying the value of first positive voltage $V_G$ such that a source voltage $V_S$ applied to the source current component yields a substantially constant source current; and after a predetermined period of time, terminating the converging step.

7. A gate memory device including an array of floating gate memory cells including a plurality of rows and columns, the device implementing a method for soft programming at least one cell in at least a portion of the array by implementing source side secondary hot electron injection and comprising:

a word line decoder connecting a plurality of word lines, each of the plurality of word lines connecting to the control gate of each of a plurality of memory cells;

a column decoder connecting a plurality of column drain lines, each of the plurality of column drain lines connecting to the drain of each of the plurality of memory cells; and a control circuit including a source current component coupled to the column decoder for converging the low threshold voltage of the at least one cell to a desired low threshold state, wherein the control circuit further comprises:

a first voltage circuit for applying a first positive voltage, $V_G$, to a selected word line of the array;

a second voltage circuit for applying a second positive voltage, $V_D$, to a common source of the array; and a timing circuit for de-energizing at least one of the first circuit and the second circuit after a pre-determined period of time.

8. The floating gate memory device of claim 7 wherein the control circuit further comprises circuitry for adjusting a source voltage $V_S$ applied to the source current component to a pre-determined voltage.

9. The floating gate memory device of claim 7 wherein the control circuit further comprises means for preventing the over soft-programming of the cell.

10. A gate memory device including an array of floating gate memory cells including a plurality of rows and columns, the device implementing a method for soft programming at least one cell in at least a portion of the array by implementing source side secondary hot electron injection and comprising:

a word line decoder connecting a plurality of word lines, each of the plurality of word lines connecting to the control gate of each of a plurality of memory cells;

a column decoder connecting a plurality of column drain lines, each of the plurality of column drain lines connecting to the drain of each of the plurality of memory cells; and a control circuit including a source current component coupled to the column decoder for converging the low threshold voltage of the at least one cell to a desired low threshold state, wherein the control circuit further comprises circuitry for adjusting a source voltage $V_S$ applied to the source current component to a pre-determined voltage, wherein the circuitry for adjusting a source voltage $V_S$ further comprises circuitry for self-biasing the source voltage $V_S$ by the threshold voltage $V_T$ distribution of the at least one cell in the portion of the array.

11. The floating gate memory device of claim 10 wherein the circuitry for self-biasing the source voltage $V_S$ further comprises circuitry for maintaining the source current $I_S$ at a constant level.

12. The floating gate memory device of claim 11 wherein the circuitry for maintaining the source current $I_S$ at a constant level further comprises a current mirror in operative combination with at least one diode.

13. The floating gate memory device of claim 11 wherein the circuitry for maintaining the source current $I_S$ at a constant level further comprises a current mirror in operative combination with at least one MOS-diode.

14. A gate memory device including an array of floating gate memory cells including a plurality of rows and columns, the device implementing a method for soft programming at least one cell in at least a portion of the array by implementing source side secondary hot electron injection and comprising:

a word line decoder connecting a plurality of word lines, each of the plurality of word lines connecting to the control gate of each of a plurality of memory cells;

a column decoder connecting a plurality of column drain lines, each of the plurality of column drain lines connecting to the drain of each of the plurality of memory cells; and a control circuit including a source current component coupled to the column decoder for converging the low threshold voltage of the at least one cell to a desired low threshold state, wherein the control circuit further comprises means for preventing the over soft-programming of the cell, wherein the means for preventing the over soft-programming of the cell further includes means for specifying the value of first positive voltage $V_G$ such that a source voltage $V_S$ applied to the source current component yields a substantially constant source current.

* * * * *